US010127967B1

(12) United States Patent
Lee et al.

(10) Patent No.: US 10,127,967 B1
(45) Date of Patent: Nov. 13, 2018

(54) DRAM AND METHOD FOR OPERATING THE SAME

(71) Applicant: NANYA TECHNOLOGY CORPORATION, New Taipei (TW)

(72) Inventors: Chung-Hsun Lee, New Taipei (TW); Hsien-Wen Liu, Taoyuan County (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 15/808,448

(22) Filed: Nov. 9, 2017

(51) Int. Cl.
*G11C 11/34* (2006.01)
*G11C 11/403* (2006.01)
*G11C 11/4096* (2006.01)

(52) U.S. Cl.
CPC ........ *G11C 11/403* (2013.01); *G11C 11/4096* (2013.01)

(58) Field of Classification Search
CPC .......................... G11C 11/403; G11C 11/4096
See application file for complete search history.

(56) References Cited

U.S. PATENT DOCUMENTS

| | | | |
|---|---|---|---|
| 9,349,431 B1 * | 5/2016 | Saifuddin | G11C 11/40611 |
| 2012/0300568 A1 * | 11/2012 | Park | G11C 11/40618 365/222 |
| 2014/0334225 A1 * | 11/2014 | Cordero | G11C 11/4076 365/149 |

* cited by examiner

*Primary Examiner* — Mohammed A Bashar
(74) *Attorney, Agent, or Firm* — Muncy, Geissler, Olds & Lowe, P.C.

(57) ABSTRACT

The present disclosure provides a dynamic random access memory (DRAM). The DRAM includes a refresh unit and an accessing device. The refresh unit includes a target row on which a read/write (R/W) operation is requested to be performed. The accessing device is configured to perform the R/W operation on the target row while the refresh unit is being refreshed.

18 Claims, 17 Drawing Sheets

DRAM AND METHOD FOR OPERATING THE SAME

TECHNICAL FIELD

The present disclosure relates to a dynamic random access memory (DRAM) and a method for operating the same, and more particularly, to a method for refreshing and reading/writing a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic 1 and a logic 0, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM. The DRAM includes a refresh unit and an accessing device. The refresh unit includes a target row on which a read/write (R/W) operation is requested to be performed. The accessing device is configured to perform the R/W operation on the target row while the refresh unit is being refreshed.

In some embodiments, the DRAM further includes a first refresh unit and a second refresh unit. The first refresh unit is assigned to a first position of a pending schedule. The second refresh unit is assigned to a second position of the pending schedule, wherein if the first refresh unit is not currently being refreshed, then, when the first refresh unit is refreshed, the first refresh unit serves as the refresh unit.

In some embodiments, the DRAM further includes a first refresh unit and a second refresh unit. The first refresh unit is assigned to a first position of a pending schedule. The second refresh unit is assigned to a second position of the pending schedule, wherein if the first refresh unit is being refreshed, then, when the second refresh unit is refreshed, the second refresh unit serves as the refresh unit.

In some embodiments, the first position is not followed by the second position in order of refresh.

In some embodiments, the first position is followed by second position in order of refresh.

In some embodiments, the DRAM further includes a first refresh unit, a second refresh unit and a third refresh unit. The first refresh unit is assigned to a first position of a pending schedule. The second refresh unit is assigned to a second position, following the first position, of the pending schedule. The third refresh unit is assigned to a third position of the pending schedule, wherein if the first refresh unit is being refreshed and the third refresh unit serves as the refresh unit, then the third refresh unit is promoted from the third position to the second position of the pending schedule.

In some embodiments, if the first refresh unit is being refreshed and if the third refresh unit serves as the refresh unit, then the second refresh unit is downgraded from the second position to the third position of the pending schedule.

In some embodiments, if the refresh unit is being refreshed, then when the target row has not been refreshed, the accessing device is configured to perform the R/W operation on the target row while the refresh unit is being refreshed.

In some embodiments, the target row is not refreshed while the refresh unit is being refreshed.

In some embodiments, a data is read from the target row when the target row is refreshed.

Another aspect of the present disclosure provides a method. The method includes providing a refresh unit including a target row on which a read/write (R/W) operation is requested to be performed; refreshing the refresh unit; and performing the R/W operation on the target row while the refresh unit is being refreshed.

In some embodiments, the method further comprises: providing a first refresh unit; providing a second refresh unit; assigning the first refresh unit to a first position of a pending schedule; assigning the second refresh unit to a second position of the pending schedule; and deeming the first refresh unit as the refresh unit when the first refresh unit is refreshed, if the first refresh unit is not currently being refreshed.

In some embodiments, the method further comprises: providing a first refresh unit; providing a second refresh unit; assigning the first refresh unit to a first position of a pending schedule; assigning the second refresh unit to a second position of the pending schedule; and deeming the second refresh unit as the refresh unit when the second refresh unit is refreshed, if the first refresh unit is currently being refreshed.

In some embodiments, the first position is not followed by the second position in order of refresh.

In some embodiments, the first position is followed by the is second position in order of refresh.

In some embodiments, the method further comprises: providing a first refresh unit; providing a second refresh unit; providing a third refresh unit; assigning the first refresh unit to a first position of a pending schedule; assigning the second refresh unit to a second position, following the first position, of the pending schedule; assigning the third refresh unit to a third position of the pending schedule; and promoting the third refresh unit from the third position to the second position of the pending schedule, if the first refresh unit is being refreshed and if the third refresh unit serves as the refresh unit.

In some embodiments, the method further comprises downgrading the second refresh unit from the second position to the third position of the pending schedule, if the first refresh unit is being refreshed and if the third refresh unit serves as the refresh unit.

In some embodiments, the method further comprises performing the R/W operation on the target row while the refresh unit is being refreshed, when the target row has not been refreshed.

In some embodiments, the method further comprises not refreshing the target row while the refresh unit is being refreshed.

In some embodiments, the method further comprises reading a data from the target row when the target row is refreshed.

In the present disclosure, since the R/W operation is performed on the memory row of the refresh unit while the refresh unit is being refreshed, the DRAM is relatively efficient.

In some existing approaches, an R/W operation is not permitted to be performed on a memory row of a refresh unit until, for example, refresh of all refresh units of the existing DRAM is completed. As a result, the existing DRAM is relatively inefficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
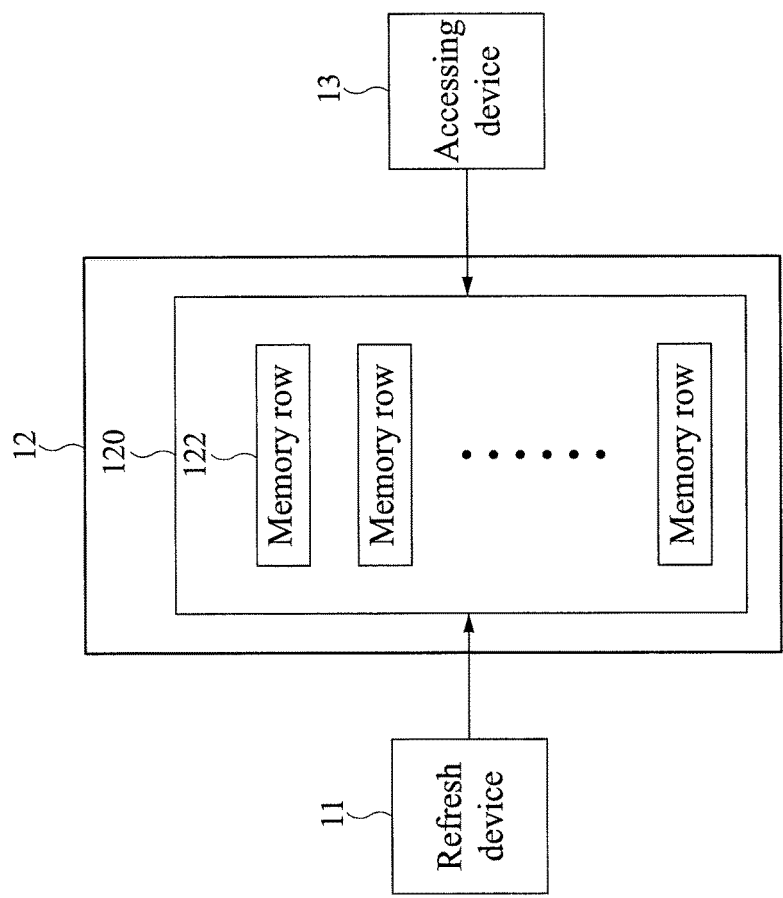
FIG. 1 is a schematic diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a dynamic random access memory (DRAM) 10, in accordance with some embodiments of the present disclosure. Referring to FIG. 1, the DRAM 10 includes a refresh device 11, a storage area 12 and an accessing device 13.

The storage area 12 includes a refresh unit 120 including a plurality of memory rows 122. The refresh unit 120 functions to store data. In further detail, each of the memory rows 122 includes a is memory cell for storing the data. In the present embodiment, the refresh unit 120 includes the memory rows 122. However, in other embodiment, the refresh unit 120 may include a single memory row 122. Moreover, in the present embodiment, the memory rows 122 of the refresh unit 120 belong to a single bank. However, the present disclosure is not limited thereto. The memory rows 122 may belong to different banks. That is, the refresh unit 120 may include a single bank, a plurality of banks, a single memory row 122, or a plurality of memory rows 122. The present disclosure is not limited to any specific type as previously mentioned.

The refresh device 11 functions to refresh the refresh unit 120 in a fashion in which, for example, a charge is read from a memory cell of the memory row 122, and a subsequent immediate the charge is written back to the memory cell 122. However, the present disclosure is not limited thereto. The refresh operation may further include other detail operations.

The accessing device 13 functions to perform a read/write (R/W) operation on the memory row 122 of the refresh unit 120 while the refresh unit 120 is being refreshed. In the following discussion, for example, the R/W operation refers to either a read operation, or a write operation.

In an embodiment, the accessing device 13 performs the write operation on the memory row 122 of the refresh unit 120 while the refresh unit 120 is being refreshed. As previously mentioned, the refresh operation includes writing the charge back to the memory cell. In addition, the writing operation includes the writing the charge to the memory cell. As such, when the write operation is performed on the memory row 122, the memory row 122 is not required to be refreshed while the refresh unit 120 is being refreshed.

In an embodiment, as previously mentioned, the refresh operation includes reading the charge from the memory cell. In addition, the read operation includes the reading of the charge from the memory cell. As such, there is no need to perform the additional reading operation. A data is able to be read from the memory row 122 when the memory row 122 is refreshed.

In the present disclosure, since the R/W operation is performed on the memory row 122 of the refresh unit 120 while the refresh unit 120 is being refreshed, the DRAM 10 is relatively efficient.

In some existing DRAMs, such as the DRAM 10 shown in FIG. 1 for instance, the R/W operation is unable to be performed on the memory row 122 of the refresh unit 120 while the refresh unit 120 is being refreshed. For example, the R/W operation is not allowed to be performed on the memory row 122 until, for example, refresh of all refresh units of the existing DRAM is completed. That is, the R/W operation cannot be performed within a reasonable time. As a result, the existing DRAM is relatively inefficient.

Figure 2:
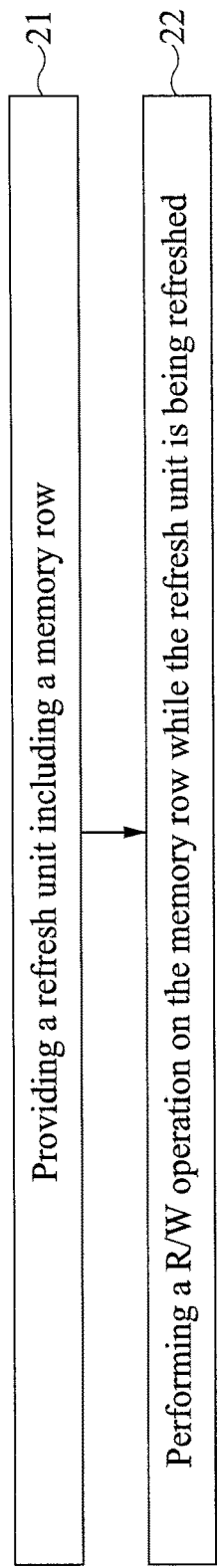
FIG. 2 is a flow diagram of a method of operating a DRAM, in accordance with some embodiments of the present disclosure.

FIG. 2 is a flow diagram of a method 20 of operating a DRAM, in accordance with some embodiments of the present disclosure. Referring to FIG. 2, which describes a method of operating the DRAM 20 illustrated with reference to FIG. 1, the method 20 includes operations 21 and 22.

The method 20 begins with operation 21, in which a refresh unit 120 including a memory row 122 is provided.

The method 20 proceeds to operation 22, in which the R/W is operation is performed on the memory row 122 of the refresh unit 120 while the refresh unit 120 is being refreshed.

In the present disclosure, since the R/W operation is performed on the memory row 122 of the refresh unit 120 while the refresh unit 120 is being refreshed, the DRAM 10 is relatively efficient.

In some existing approaches, taking the DRAM 10 shown in FIG. 1 for instance, the R/W operation is not allowed to be performed on the memory row 122 until, for example, refresh of all refresh units of the existing DRAM is completed. As a result, the existing DRAM is relatively inefficient.

Figure 3:
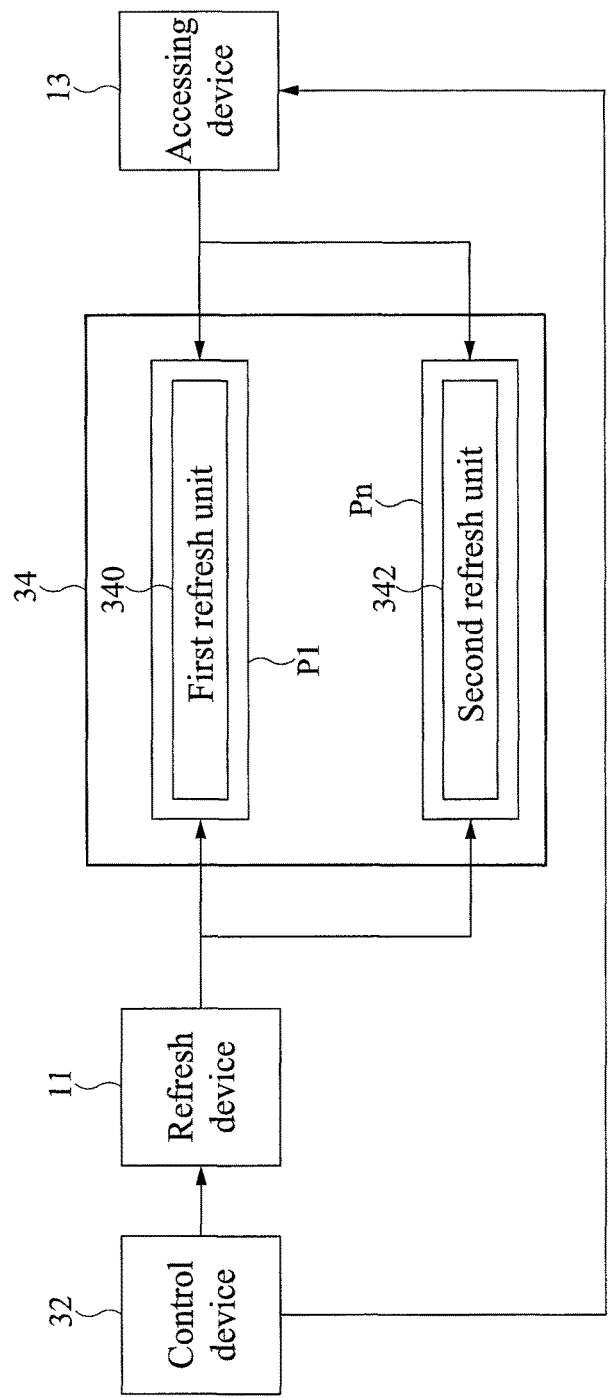
FIG. 3 is a schematic diagram of another dynamic random access memory (DRAM), in accordance with some embodiments of the present disclosure.

FIG. 3 is a schematic diagram of another dynamic random access memory (DRAM) 30, in accordance with some embodiments of the present disclosure. Referring to FIG. 3, the DRAM 30 is similar to the DRAM 10 described and illustrated with reference to FIG. 1 except that, for example, the DRAM 30 includes a control device 32 and a storage area 34 including a first refresh unit 340 and a second refresh unit 342.

Functions of each of the first refresh unit 340 and the second refresh unit 342 are the same as that of the refresh unit 120. Therefore, the detailed descriptions to the first and second refresh units 340 and 342 are omitted herein. Moreover, for clarity of illustration, memory rows 122 of each of the first refresh unit 340 and the second refresh unit 342 are not depicted.

The first refresh unit 340 is assigned to a first position P1 of a pending schedule. The second refresh unit 342 is assigned to an nth position Pn of the pending schedule, wherein n is a positive integer except for 1.

In the present disclosure, a term "pending" includes two scenarios. In the first scenario, a refresh unit has not been refreshed yet. In the second scenario, a refresh unit is being refreshed, while the refresh of the refresh unit has not been completed yet. As such, the pending schedule refers to a timetable of the pending refresh unit.

Additionally, the refresh device 11 performs a refresh operation according to the pending schedule. For example, since the first refresh unit 340 is assigned to the first position P1, the first unit 340 is refreshed first. A refresh unit assigned to a second position of the pending schedule (associated with order of refresh) is not refreshed until the refresh of the first refresh unit 340 is completed, and so on. In some embodiments of the present disclosure, the nth position is a second position of the pending schedule, which means that a refresh unit assigned to the second position is not refreshed until the refresh of the first refresh unit 340 is completed.

The control device 32 functions to determine whether the first refresh unit 42 is being refreshed, and, based on the determination result, control the refresh operation of the refresh device 11 and an R/W operation of the accessing device 13, which will be described and illustrated in detail with reference to FIGS. 4 to 7.

Figure 4:
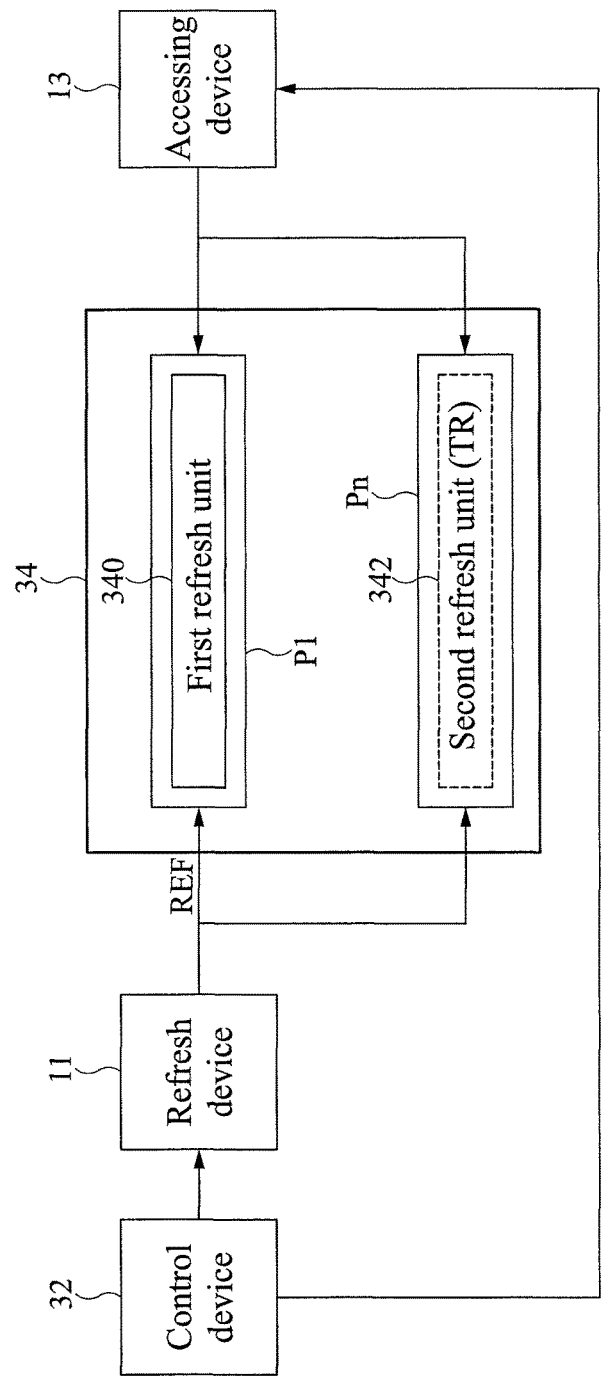
FIG. 4 is a schematic diagram illustrating an operation of the DRAM shown in FIG. 3 in a scenario, in accordance with some embodiments of the present disclosure.
Figure 5:
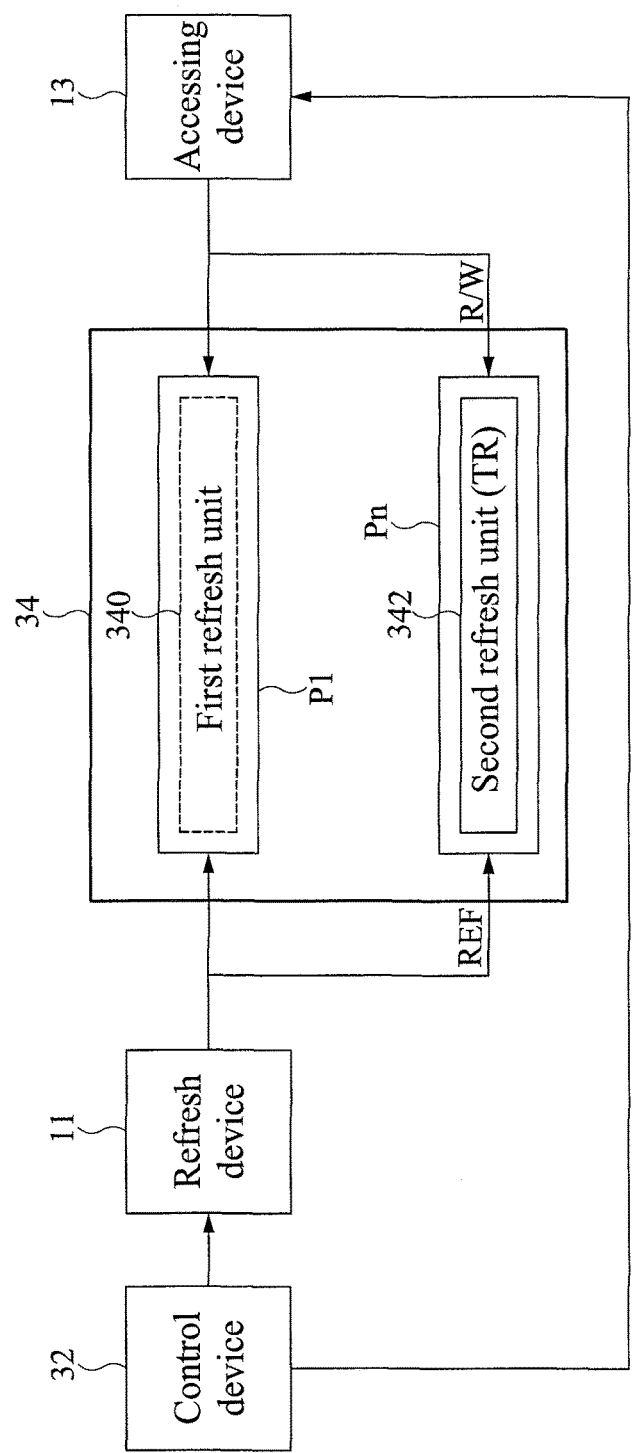
FIG. 5 is a schematic diagram illustrating another operation of the DRAM shown in FIG. 3 in the scenario, in accordance with some embodiments of the present disclosure.

FIG. 4 is a schematic diagram illustrating an operation of the DRAM 30 shown in FIG. 3 in a scenario, in accordance with some embodiments of the present disclosure. FIG. 5 is a schematic diagram illustrating another operation of the DRAM 30 shown in FIG. 3 in the scenario, in accordance with some embodiments of the present disclosure. FIGS. 4 and 5 illustrate operations in the scenario in which the first refresh unit 340 is being refreshed, and the second refresh unit 342 includes a target row TR on which the R/W operation is requested to be performed.

In operation, referring to FIG. 4, the control device 32 determines that the first refresh unit 340 is being refreshed, as depicted by a solid frame. Accordingly, the control device 32 controls the refresh device 11 and the accessing device 13, as shown in FIG. 5. Referring to FIG. 5, the refresh of the first refresh unit 340 is completed as depicted by a dashed frame, and the second refresh unit 342 is being refreshed as depicted by a solid frame. The accessing device 13 performs the R/W operation on the target row TR of the second refresh unit 342 while the second refresh unit 342 is being refreshed.

Figure 6:
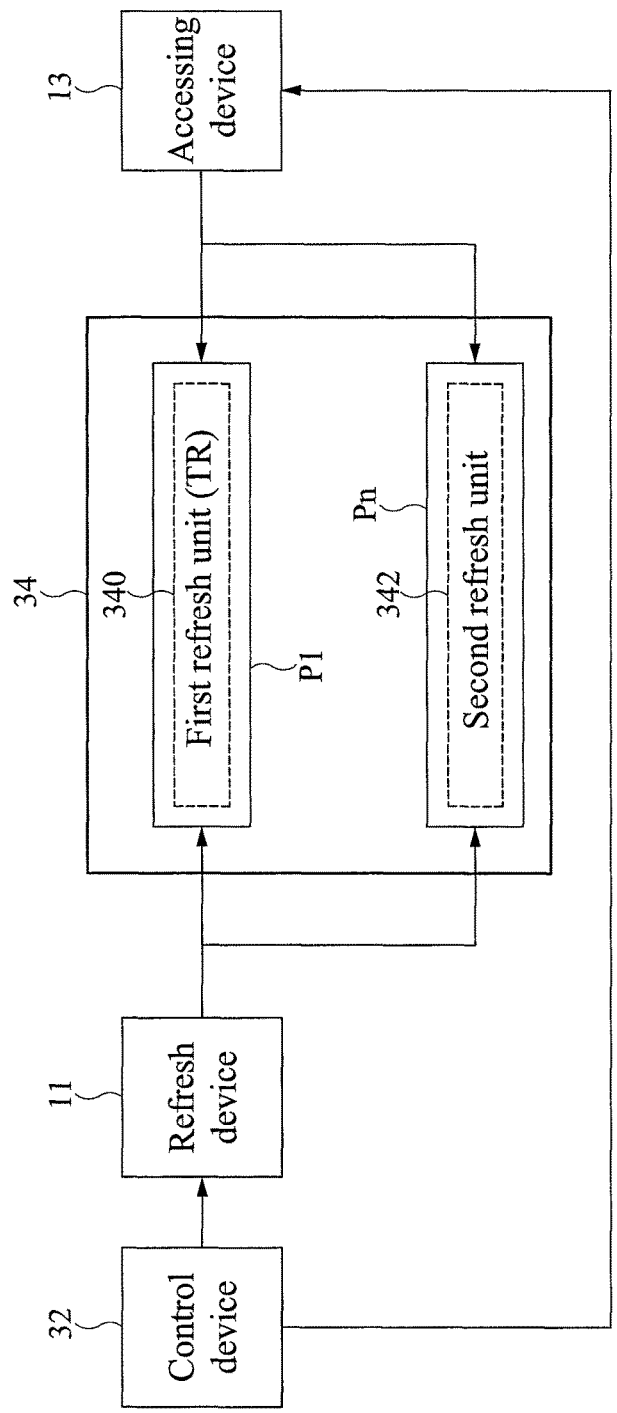
FIG. 6 is a schematic diagram illustrating an operation of the DRAM shown in FIG. 3 in another scenario, in accordance with some embodiments of the present disclosure.
Figure 7:
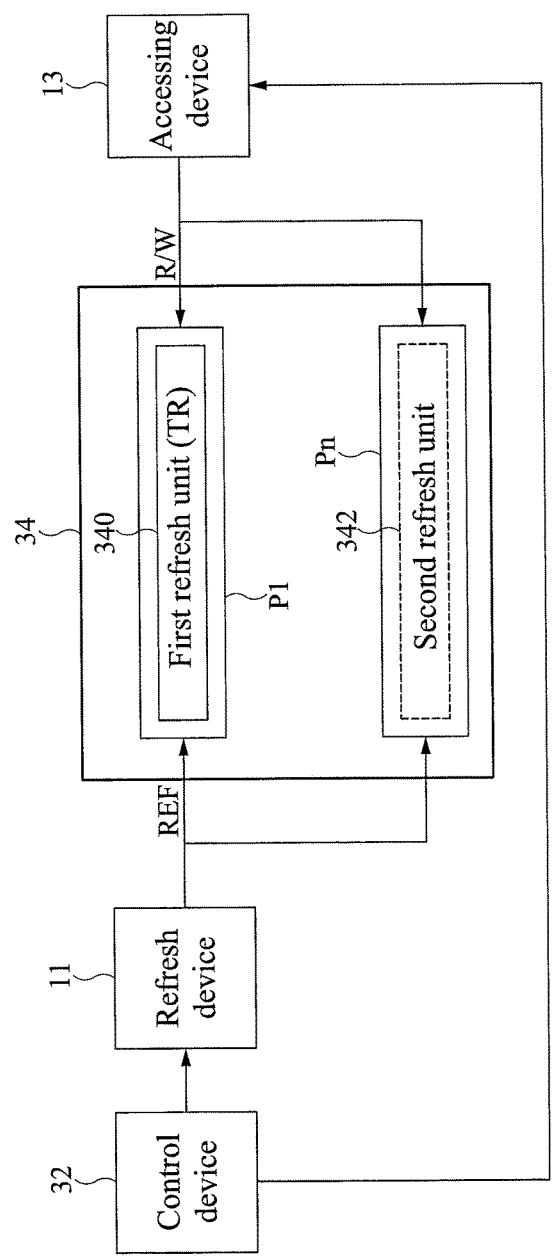
FIG. 7 is a schematic diagram illustrating another operation of the DRAM shown in FIG. 3 in the other scenario, in accordance with some embodiments of the present disclosure.

FIG. 6 is a schematic diagram illustrating an operation of the DRAM 30 shown in FIG. 3 in another scenario, in accordance with some embodiments of the present disclosure. FIG. 7 is a schematic diagram illustrating another operation of the DRAM 30 shown in FIG. 3 in the other scenario, in accordance with some embodiments of the present disclosure. FIGS. 6 and 7 illustrate operations in the scenario in which the first refresh unit 340 is not being refreshed, and the first refresh unit 340 includes the target row TR. As previously mentioned, the pending includes the two scenarios. Since the scenario of FIGS. 6 and 7 is not the second scenario, the scenario of FIGS. 6 and 7 is the first scenario, in which the first refresh unit 340 has not been refreshed yet.

In operation, referring to FIG. 6, the control device 32 determines that the first refresh unit 340 is not being refreshed as depicted by a dashed frame. Accordingly, the control device 32 controls the refresh device 11 and the accessing device 13, as shown in FIG. 7. Referring to FIG. 7, the refresh device 11 refreshes the first refresh unit 340 as depicted by a solid frame. The accessing device 13 performs the R/W operation on the target row TR of the first refresh unit 340 while the first refresh unit 340 is being refreshed.

In the present disclosure, since the R/W operation is performed on the target row TR of the first refresh unit 340 while the first refresh unit 340 is being refreshed or on the target row TR of the second refresh unit 342 while the second refresh unit 342 is being refreshed, the DRAM 30 is relatively efficient.

Figure 8:
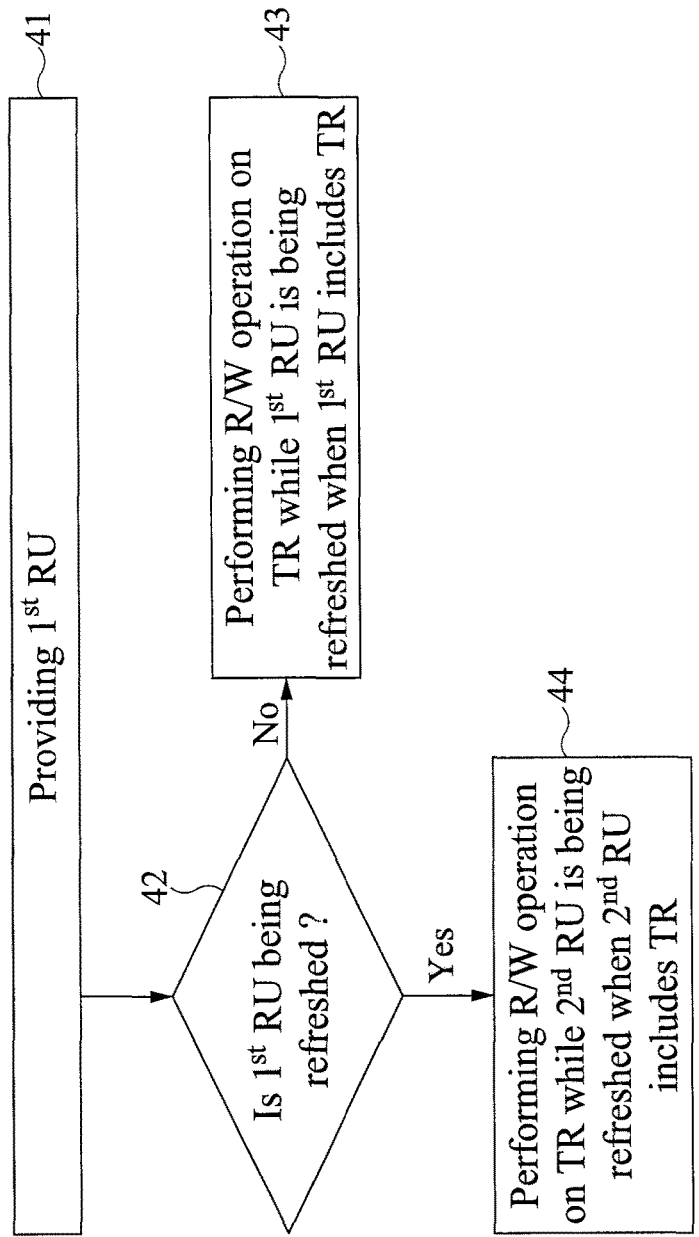
FIG. 8 is a flow diagram of a method of operating the DRAM shown in FIG. 3, in accordance with some embodiments of the present disclosure.

FIG. 8 is a flow diagram of a method 40 of operating the DRAM 30 shown in FIG. 3, in accordance with some embodiments of the present disclosure. Referring to FIG. 8, the method 40 includes operations 41, 42, 43 and 44.

The method 40 begins with operation 41, in which the first refresh unit 340 is provided.

The method 40 proceeds to operation 42, in which the control device 32 determines whether the first refresh unit 340 is being refreshed. If negative, the method 40 proceeds to operation 43, in which the accessing device 13 performs the R/W operation on the target row TR of the first refresh unit 340 while the first refresh unit 340 is being refreshed, when the first refresh unit 340 includes the target row TR. If affirmative, the method 40 proceeds to operation 44, in which the accessing device 13 performs the R/W operation on the target row TR of the second refresh unit 342 while the second refresh unit 342 is refreshed, when the second refresh unit 342 includes the target row RW.

In the present disclosure, the R/W operation is performed on the target row TR of the first refresh unit 340 while the first refresh unit 340 is being refreshed or on the target row TR of the second refresh unit 342 while the second refresh unit 342 is being refreshed. As a result, a DRAM adopting the method 40 is relatively efficient.

Figure 9:
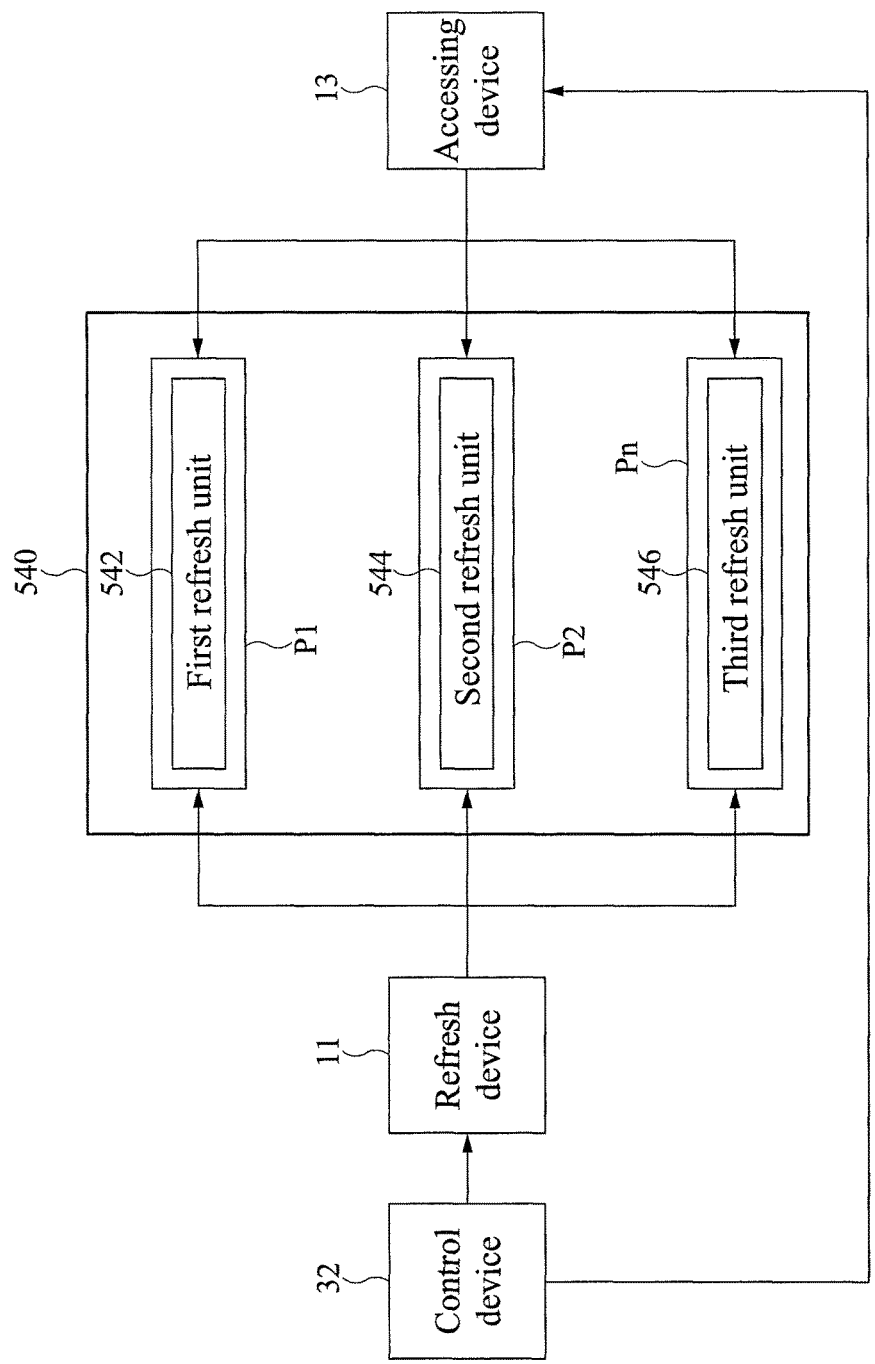
FIG. 9 is a schematic diagram of yet another dynamic random access memory (DRAM), in accordance with some embodiments of the present disclosure.

FIG. 9 is a schematic diagram of yet another dynamic random access memory (DRAM) 50, in accordance with some embodiments of the present disclosure. Referring to FIG. 9, the DRAM 50 is similar to the DRAM 30 described and illustrated with reference to FIG. 3 except that, for example, the DRAM 50 includes a storage area 540 including a first refresh unit 542, a second refresh unit 544 and a third refresh unit 546.

Functions of each of the first refresh unit 542, the second refresh unit 544 and the third refresh unit 546 are the same as that of the refresh unit 120. Therefore, the detailed descriptions to such functions are omitted herein. Moreover, for clarity of illustration, memory rows 122 of each of the first refresh unit 542, the second refresh unit 544 and the third refresh unit 546 are not depicted.

The first refresh unit 542 is assigned to a first position P1 of a pending schedule. The second refresh unit 544 is assigned to a second position P2, following the first position P1, of the pending schedule. The third refresh unit 546 is assigned to an nth position Pn of the pending schedule, wherein n is a positive integer except for 1 and 2.

In contrast to the embodiment of FIG. 3, the control device 32 further performs a promotion operation, which will be described and illustrated in detail with reference to FIGS. 9 to 15. As such, the DRAM 50 is relatively further efficient.

Figure 10:
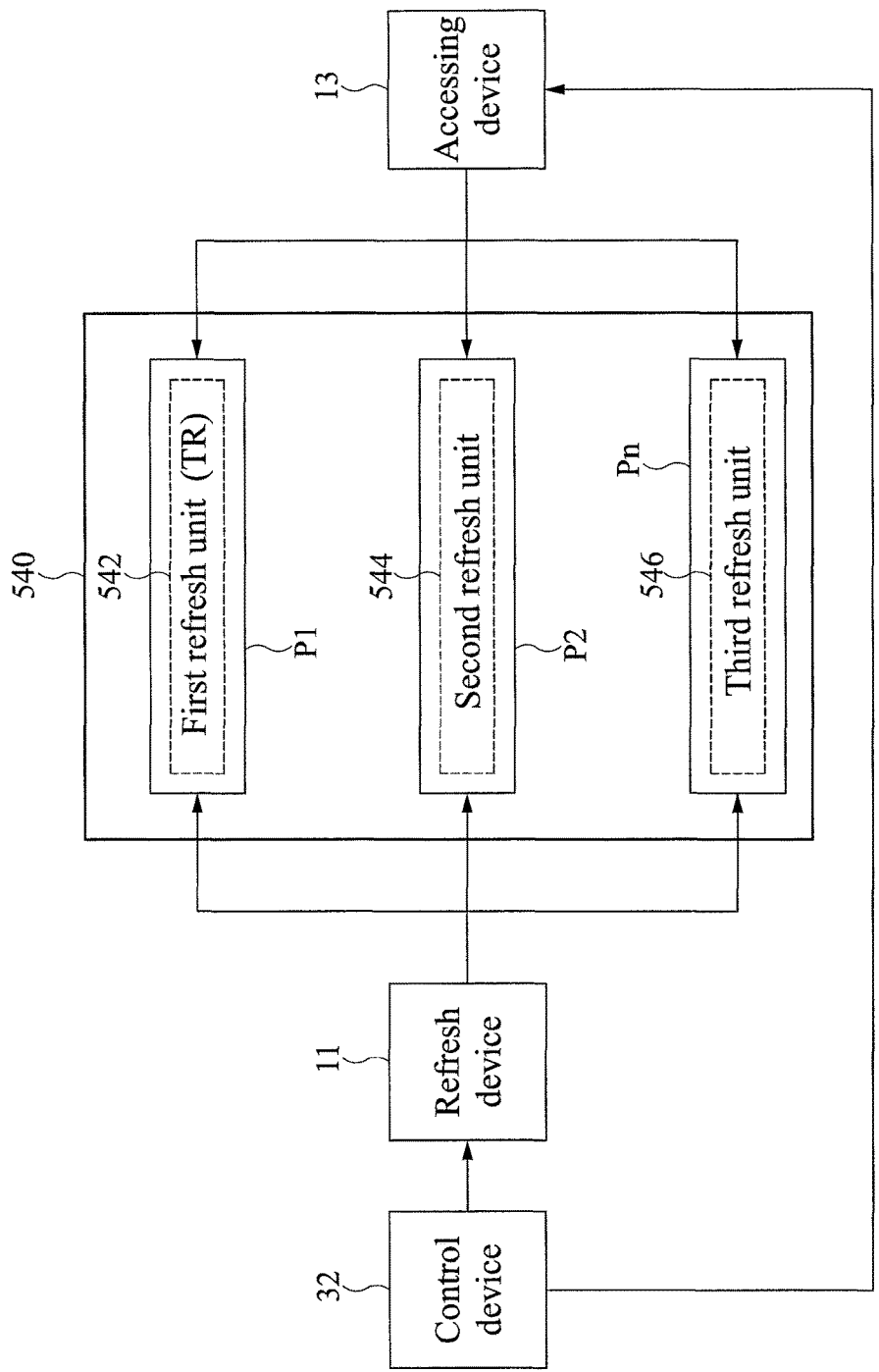
FIG. 10 is a schematic diagram illustrating an operation of the DRAM shown in FIG. 9 in a first scenario, in accordance with some embodiments of the present disclosure.
Figure 11:
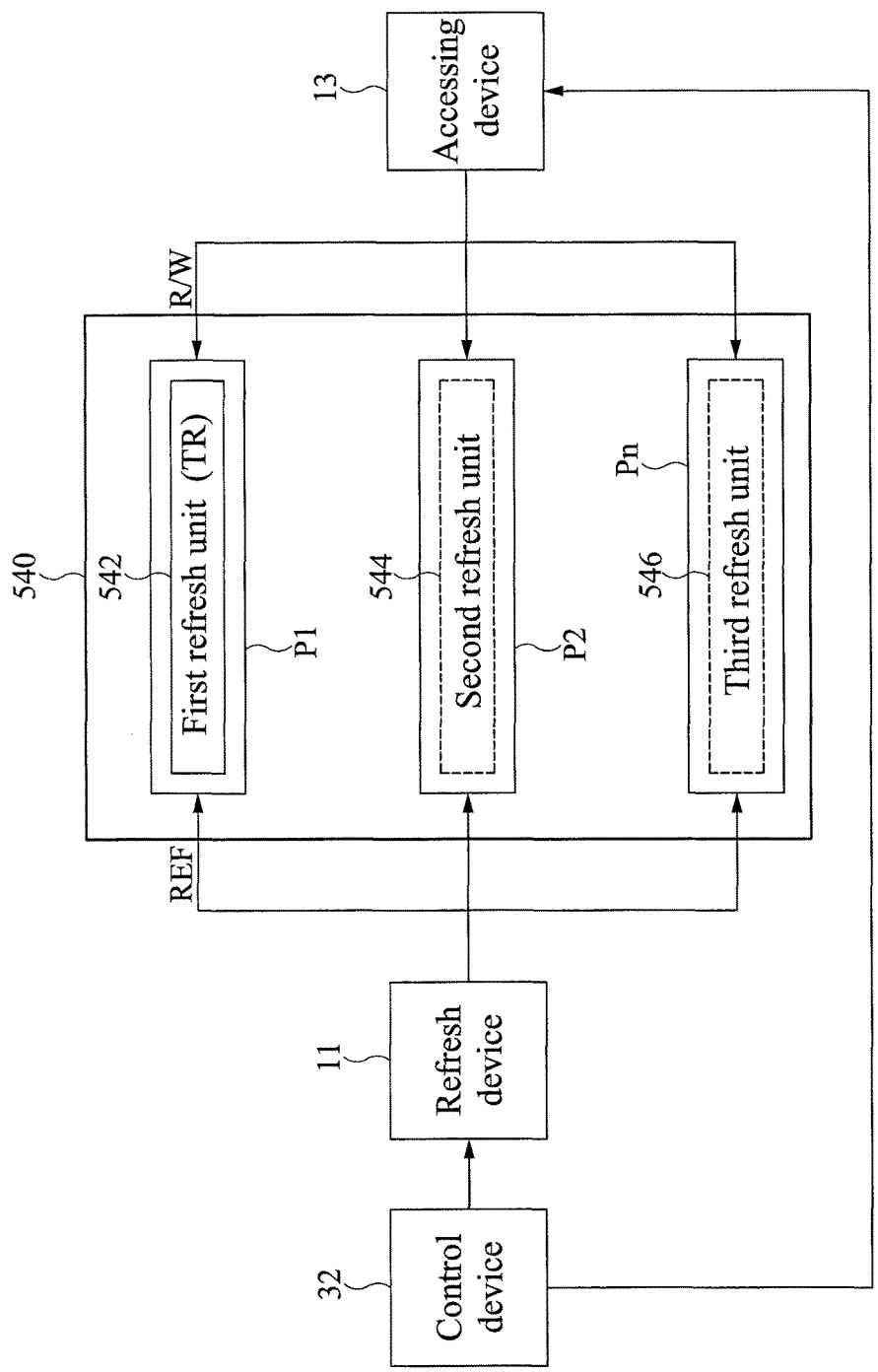
FIG. 11 is a schematic diagram illustrating another operation of the DRAM shown in FIG. 9 in the first scenario, in accordance with some embodiments of the present disclosure.

FIG. 10 is a schematic diagram illustrating an operation of the DRAM 50 shown in FIG. 9 in a first scenario, in accordance with some embodiments of the present disclosure. FIG. 11 is a schematic diagram illustrating another operation of the DRAM 50 shown in FIG. 9 in the first scenario, in accordance with some embodiments of the present disclosure. FIGS. 9 and 10 illustrate operations in the first scenario in which the first refresh unit 542 is not being refreshed, and the first refresh unit 542 includes the target row TR. As previously mentioned, the pending includes the two scenarios. Since the first scenario of FIGS. 9 and 10 is not the second scenario, the scenario of FIGS. 9 and 10 is the first scenario, in which the first refresh unit 542 has not been refreshed yet.

In operation, referring to FIG. 10, the control device 32 determines that the first refresh unit 542 is not being refreshed, as depicted by a dashed frame. Accordingly, the control device 32 controls the refresh device 11 and the accessing device 13, as shown in FIG. 11. Referring to FIG. 11, the refresh device 11 refreshes the first refresh unit 542 as depicted by a solid frame. The accessing device 13 performs the R/W operation on the target row TR of the first refresh unit 542 while the first refresh unit 542 is being refreshed.

Figure 12:
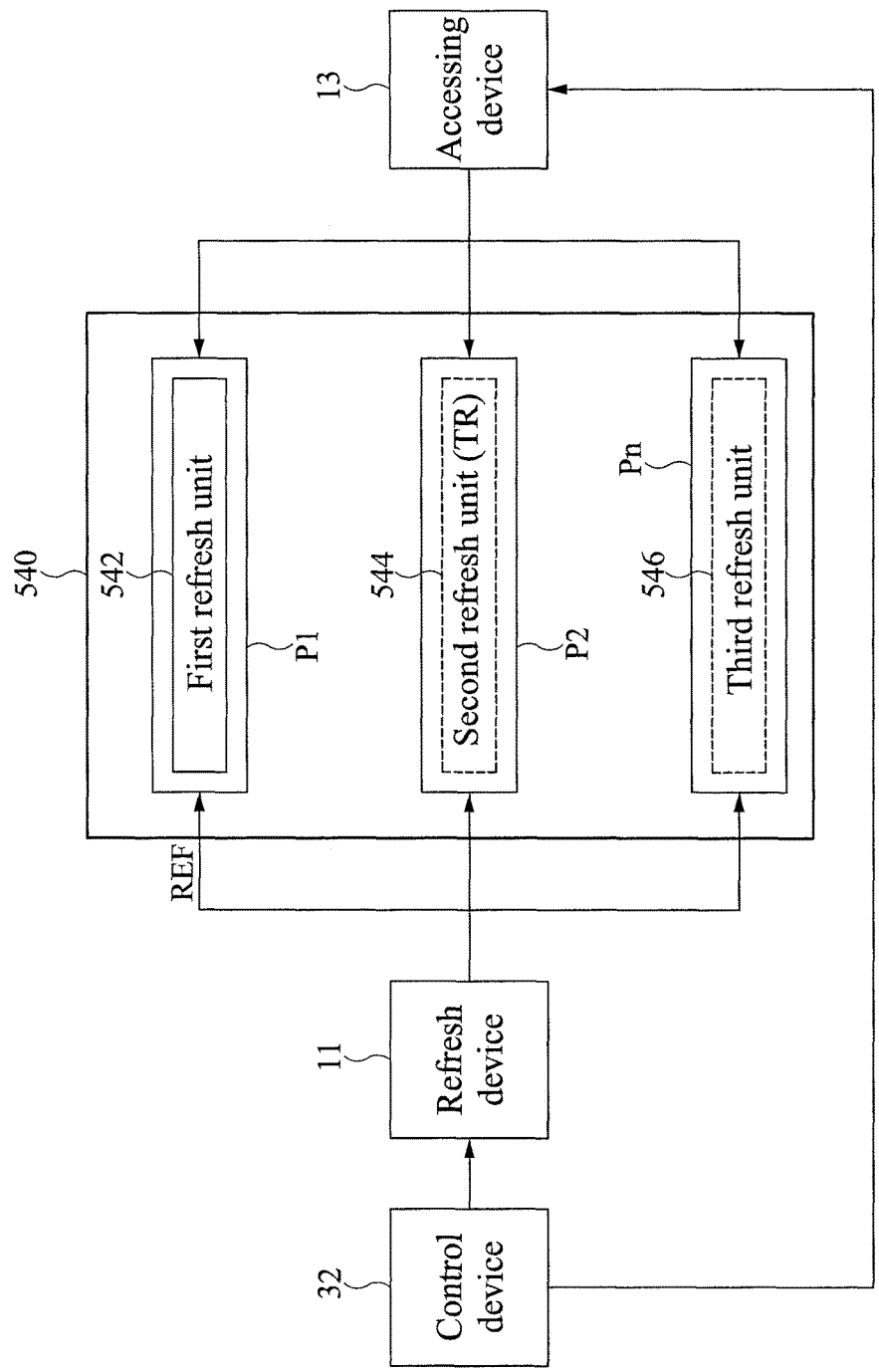
FIG. 12 is a schematic diagram illustrating an operation of the DRAM shown in FIG. 9 in a second scenario, in accordance with some is embodiments of the present disclosure.
Figure 13:
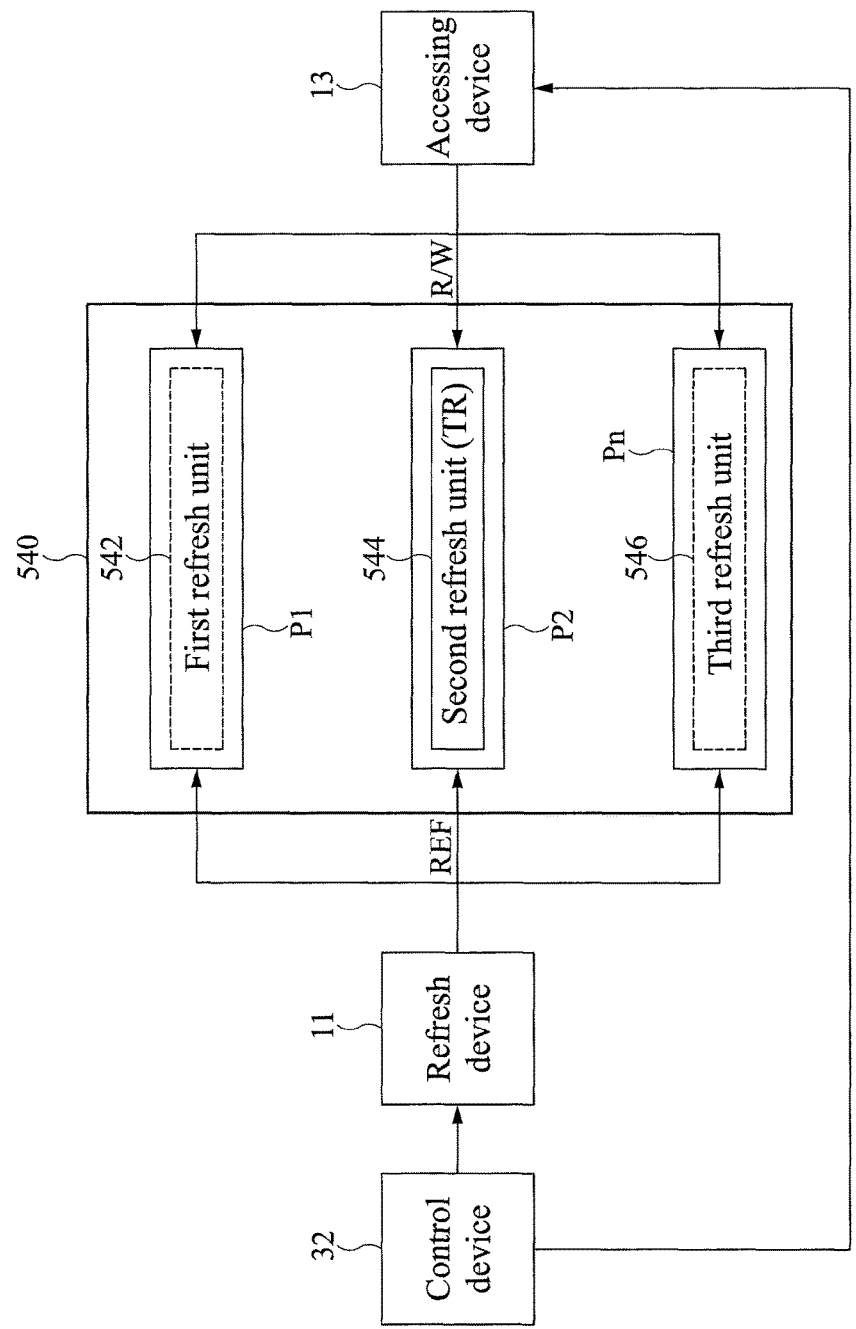
FIG. 13 is a schematic diagram illustrating another operation of the DRAM shown in FIG. 9 in the second scenario, in accordance with some embodiments of the present disclosure.

FIG. 12 is a schematic diagram illustrating an operation of the DRAM 50 shown in FIG. 9 in a second scenario, in accordance with some embodiments of the present disclosure. FIG. 13 is a schematic diagram illustrating another operation of the DRAM 50 shown in FIG. 9 in the second scenario, in accordance with some embodiments of the present disclosure. FIGS. 12 and 13 illustrate operations in the second scenario in which the first refresh unit 542 is being refreshed, and the second refresh unit 544 includes the target row TR.

In operation, referring to FIG. 12, the control device 32 determines that the first refresh unit 542 is being refreshed, as depicted by a solid frame. Moreover, the control device 32 determines that the second refresh unit 544 includes the target row TR. Accordingly, the control device 32 controls the refresh device 11 and the accessing device 13, as shown in FIG. 13. Referring to FIG. 13, the refresh of the first refresh unit 542 is completed as depicted by a dashed frame, and the second refresh unit 544 is being refreshed as depicted by a solid frame. The accessing device 13 performs the R/W operation on the target row TR of the second refresh unit 544 while the second refresh unit 544 is being refreshed.

Figure 14:
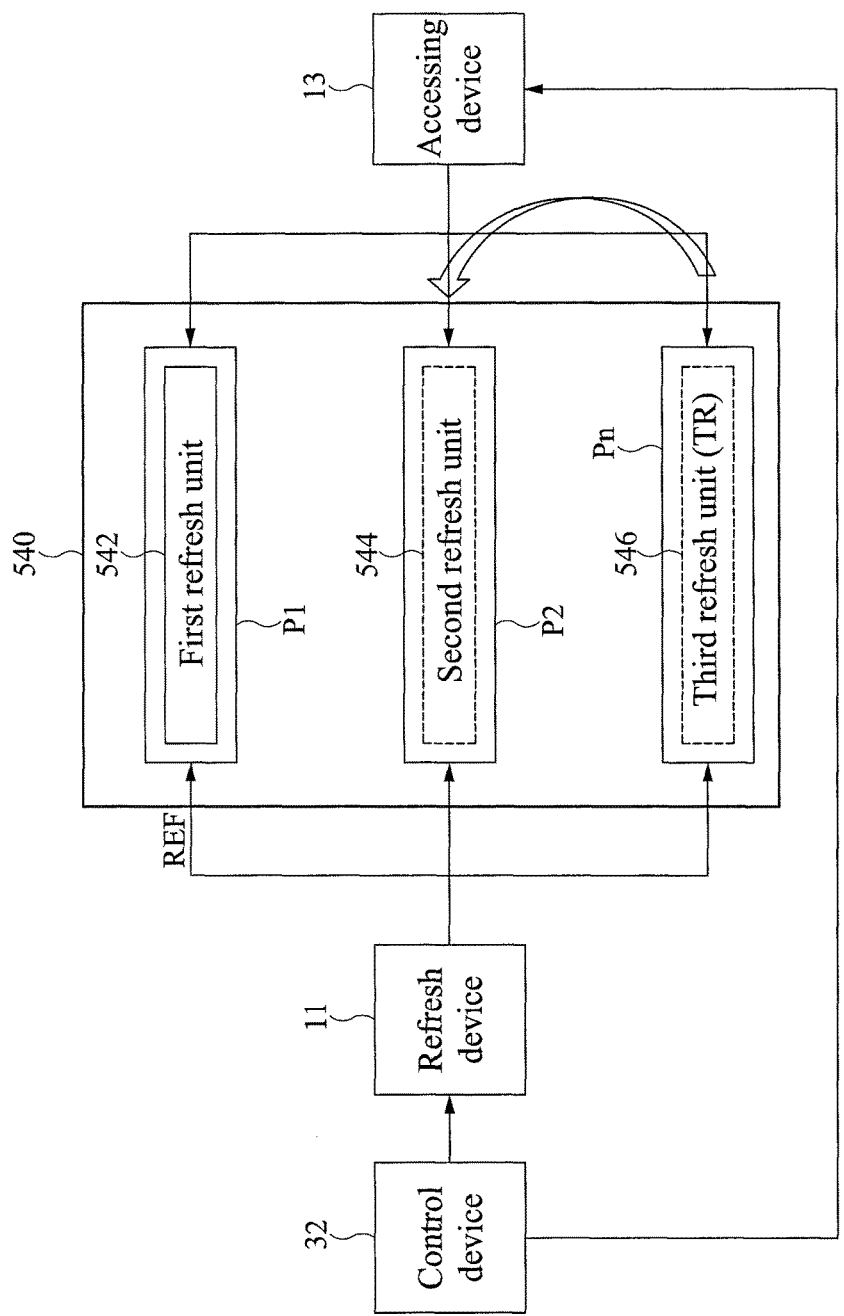
FIG. 14 is a schematic diagram illustrating an operation of the DRAM shown in FIG. 9 in a third scenario, in accordance with some embodiments of the present disclosure.
Figure 15:
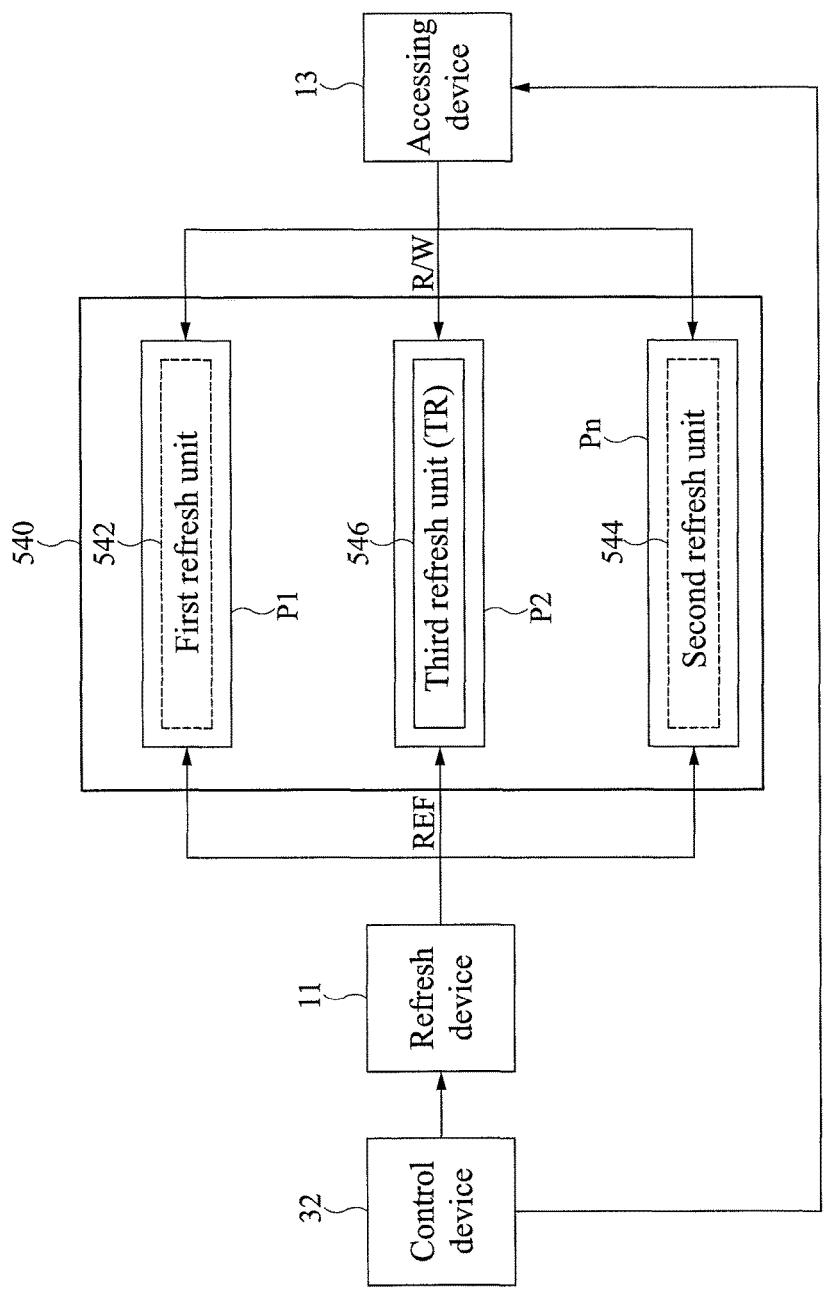
FIG. 15 is a schematic diagram illustrating another operation of the DRAM shown in FIG. 9 in the third scenario, in accordance with some embodiments of the present disclosure.

FIG. 14 is a schematic diagram illustrating an operation of the DRAM 50 shown in FIG. 9 in a third scenario, in accordance with some embodiments of the present disclosure. FIG. 15 is a schematic diagram illustrating another operation of the DRAM 50 shown in FIG. 9 in the third scenario, in accordance with some embodiments of the present disclosure. FIGS. 14 and 15 illustrate operations in the third scenario in which the first refresh unit 542 is being refreshed, and the third refresh unit 546 includes the target row TR.

In operation, referring to FIG. 14, the control device 32 determines that the first refresh unit 542 is being refreshed, as depicted by a solid frame. Moreover, the control device 32 determines that the second refresh unit 544 in the second position P2 does not include the target row TR, and determines that the third refresh unit 546 in the nth position Pn includes the target row TR. Accordingly, the control device 32 controls the refresh device 11, the accessing device 13 and is the storage area 540, as shown in FIGS. 14 and 15.

Referring to FIG. 15, the control device 32 promotes the third refresh unit 546 from the nth position Pn to the second position P2. As such, after the refresh of the first refresh unit 542 is completed, the refresh device 11 refreshes the third refresh unit 546 in the second position P2. The accessing device 13 performs the R/W operation on the target row TR of the third refresh unit 546 while the third refresh unit 546 is being refreshed.

Since the third refresh unit 546 including the target row TR is promoted to the second position P2, the R/W operation can be performed immediately. As such, the DRAM 50 is relatively further efficient. Otherwise, if the third refresh unit 546 is not promoted, the R/W operation is not performed until the third refresh unit 546 in the nth position is refreshed.

In some embodiments, the control device 32 determines whether the second refresh unit 544 includes the target row TR by comparing a refresh address of a memory row of the second refresh unit 546 and a read/write address of the target row TR. When the refresh address is identical to the read/write address, the control device 32 determines that the second refresh unit 544 includes the target row TR.

In some embodiments, the control device 32 promotes the third refresh unit 546 by interchanging positions of the third refresh unit 546 and the second refresh unit 544. For example, the third refresh unit 546 is promoted from the nth position to the second position P2, and the second refresh unit 544 is downgraded from the second position P2 to the nth position. However, the present disclosure is not limited thereto. The second refresh unit 544 may be downgraded to any position of the pending schedule.

Figure 16:
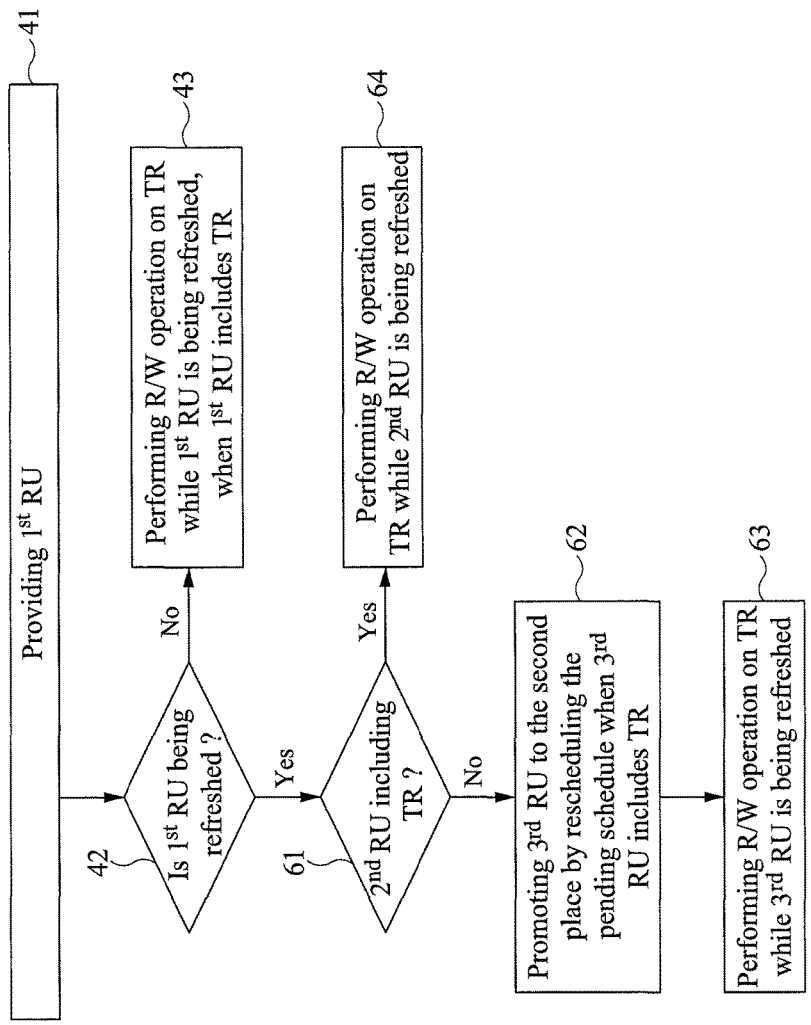
FIG. 16 is a flow diagram of a method of operating the DRAM shown in FIG. 9, in accordance with some embodiments of the present disclosure.

FIG. 16 is a flow diagram of a method 60 of operating the DRAM 50 shown in FIG. 9, in accordance with some embodiments of the present disclosure. Referring to FIG. 16, the method 60 is similar to the method 40 described and illustrated with reference to FIG. 8 except that, for example, the method 60 includes operations 61, 62, 63 and 64.

Subsequent to operation 42, if affirmative, the method 60 proceeds to operation 61. In operation 61, the control device 31 determines whether the second refresh unit 544 includes the target row TR. If affirmative, the method 60 proceeds to operation 64, in which the accessing device 13 performs the R/W operation on the target row TR while the second refresh unit 544 is being refreshed. If negative, the method 60 proceeds to operation 62, in which the third refresh unit 546 is promoted from the nth position Pn to the second position P2 by rescheduling the pending schedule when the third refresh unit 546 includes the target row TR.

The method 60 continues with operation 63, in which the accessing device 13 performs the R/W operation on the target row TR of the third refresh unit 546 while the third refresh unit 546 is being refreshed.

Figure 17:
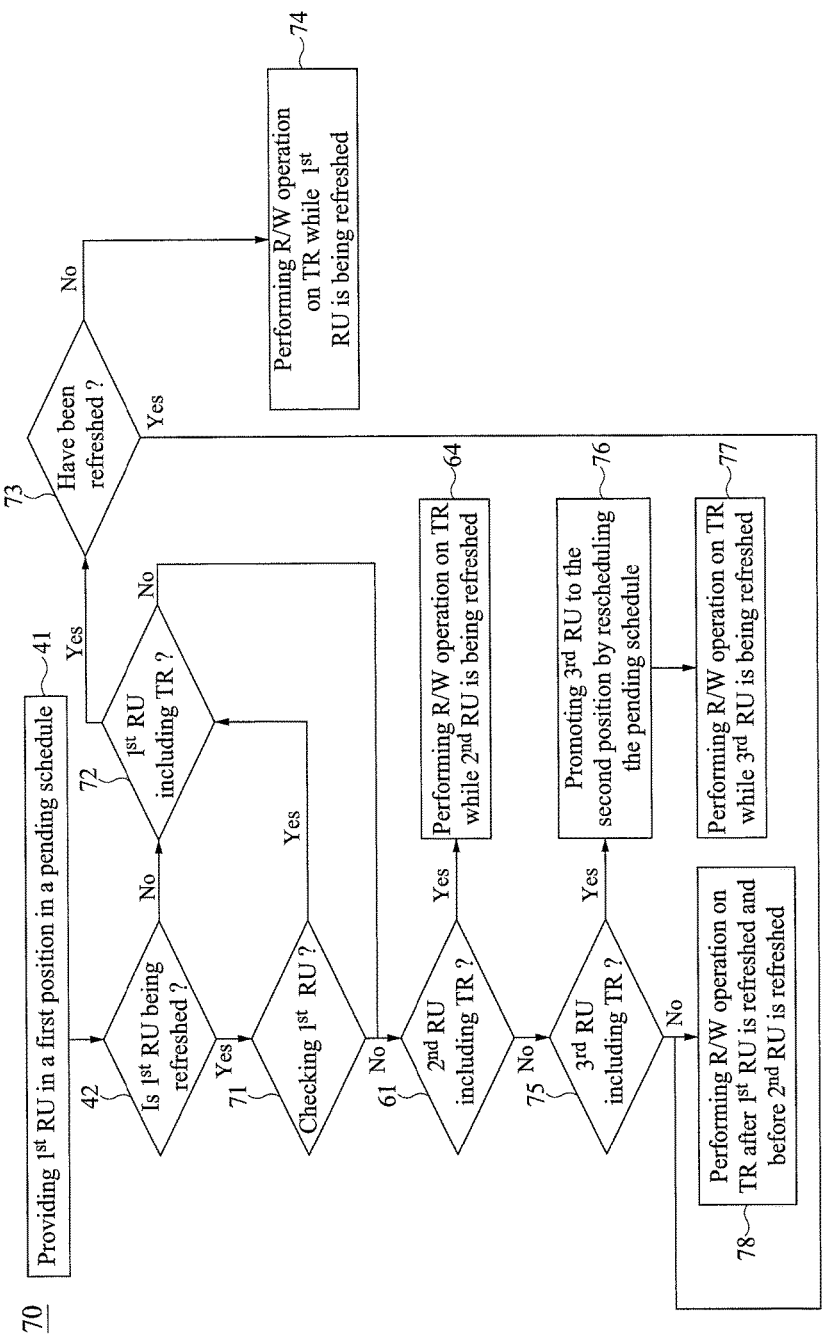
FIG. 17 is a flow diagram of another method of operating the DRAM shown in FIG. 9, in accordance with some embodiments of the present disclosure.

FIG. 17 is a flow diagram of another method 70 of operating the DRAM 50 shown in FIG. 9, in accordance with some embodiments of the present disclosure. Referring to FIG. 17, the method 70 is similar to the method 60 described and illustrated with reference to FIG. 16 except that, for example, the method 70 includes operations 71, 72, 73, 74, 75, 76, 77 and 78.

Subsequent to operation 42, if affirmative, the method 70 proceeds to operation 71, in which the control device 32 determines whether to check the first refresh unit 542. If negative, the method 70 proceeds to operation 61. If affirmative, the method 71 proceeds to operation 72.

In operation 72, the control device 32 determines whether the first refresh unit 542 includes the target row TR. In an embodiment, the control device 32 performs such determination by comparing a read/write address of the target row TR to a refresh address of the first refresh unit 542. If negative, the method 70 returns to operation 61. If affirmative, the method 70 proceeds to operation 73.

In operation 73, the control device 32 determines whether the target row TR has been refreshed. If negative, the method 70 proceeds to operation 74, in which the accessing device 13 performs the R/W operation on the target row TR while the first refresh unit 542 is being refreshed. For example, the first refresh unit 542 includes two memory rows 122, and the second memory row 122 serves as the target row TW. In a circumstance, the first memory row 122 is being refreshed. As such, the control device 32 determines that the first refresh unit 542 is being refreshed. However, the second memory row 122 has not being refreshed yet. As such, when the refresh device 11 refreshes the second memory row 122 of the first refresh unit 542, the accessing device 13 performs the R/W operation on the second memory row 122. If affirmative, the method 70 proceeds to operation 78, in which the accessing device 13 performs the R/W operation on the target row TR after the first refresh unit 542 is refreshed and before the second refresh unit 544 is refreshed.

Subsequent to operation 61, if negative, the method 70 proceeds to operation 75. In operation 75, the control device 32 determines whether the third refresh unit 546 includes the target row TR. If negative, the method 70 proceeds to operation 78. If affirmative, the control device 31 promotes the third refresh unit 546 from the nth position Pn to the second position P2 of the pending schedule. Following the operation 76, in operation 77, the accessing device 31 performs the R/W operation on the target row TR while the third refresh unit 546 is being refreshed.

In the present disclosure, since the R/W operation is performed on the memory row 122 of the refresh unit 120 while the refresh unit 120 is being refreshed, the DRAM 10 is relatively efficient.

In some existing approaches, taking the DRAM 10 shown in FIG. 1 for instance, the R/W operation is not allowed to be performed on the memory row 122 until, for example, refresh of all refresh units of the existing DRAM is completed. As a result, the existing DRAM is relatively inefficient.

One aspect of the present disclosure provides a DRAM. The DRAM includes a refresh unit and an accessing device. The refresh unit includes a target row on which a read/write (R/W) operation is requested to be performed. The accessing device is configured to to perform the R/W operation on the target row while the refresh unit is being refreshed.

Another aspect of the present disclosure provides a method. The method includes providing a refresh unit including a target row on which a read/write (R/W) operation is requested to be performed; refreshing the refresh unit; and performing the R/W operation on the target row while the refresh unit is being refreshed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
   a refresh unit including a target row on which a read/write (R/W) operation is requested to be performed; and
   an accessing device configured to perform the R/W operation on the target row while the refresh unit is being refreshed;
   wherein if the refresh unit is being refreshed, and the target row has not been refreshed, then the accessing device is configured to perform the R/W operation on the target row while the refresh unit is being refreshed.

2. The DRAM of claim 1, further comprising:
   a first refresh unit assigned to a first position of a pending schedule; and
   a second refresh unit assigned to a second position of the pending schedule,
   wherein if the first refresh unit is not currently being refreshed, then, when the first refresh unit is refreshed, the first refresh unit serves as the refresh unit.

3. The DRAM of claim 1, further comprising:
   a first refresh unit assigned to a first position of a pending schedule; and
   a second refresh unit assigned to a second position of the pending schedule,
   wherein if the first refresh unit is being refreshed, then, when the second refresh unit is refreshed, the second refresh unit serves as the refresh unit.

4. The DRAM of claim 3, wherein the first position is not followed by the second position in order of refresh.

5. The DRAM of claim 3, wherein the first position is followed by the second position in order of refresh.

6. The DRAM of claim 1, further comprising:
   a first refresh unit assigned to a first position of a pending schedule; and
   a second refresh unit assigned to a second position, following the first position, of the pending schedule, and
   a third refresh unit assigned to a third position of the pending schedule,
   wherein if the first refresh unit is being refreshed and the third refresh unit serves as the refresh unit, then the third refresh unit is promoted from the third position to the second position of the pending schedule.

7. The DRAM of claim 6, wherein if the first refresh unit is being refreshed and the third refresh unit serves as the refresh unit, then the second refresh unit is downgraded from the second position to the third position of the pending schedule.

8. The DRAM of claim 1, wherein the target row is not refreshed while the refresh unit is being refreshed.

9. The DRAM of claim 1, wherein a data is read from the target row when the target row is refreshed.

10. A method, comprising:
    providing a refresh unit including a target row on which a read/write (R/W) operation is requested to be performed;
    refreshing the refresh unit; and
    performing the R/W operation on the target row while the refresh unit is being refreshed, when the target row has not been refreshed.

11. The method of claim 10, further comprising:
    providing a first refresh unit;
    providing a second refresh unit;
    assigning the first refresh unit to a first position of a pending schedule;
    assigning the second refresh unit to a second position of the pending schedule; and
    deeming the first refresh unit as the refresh unit when the first refresh unit is refreshed, if the first refresh unit is not currently being refreshed.

12. The method of claim 10, further comprising:
    providing a first refresh unit;
    providing a second refresh unit;
    assigning the first refresh unit to a first position of a pending schedule;
    assigning the second refresh unit to a second position of the pending schedule; and
    deeming the second refresh unit as the refresh unit when the second refresh unit is refreshed, if the first refresh unit is currently being refreshed.

13. The method of claim 12, wherein the first position is not followed by the second position in order of refresh.

14. The method of claim 12, wherein the first position is followed by the second position in order of refresh.

15. The method of claim 10, further comprising:
    providing a first refresh unit;
    providing a second refresh unit;
    providing a third refresh unit;
    assigning the first refresh unit to a first position of a pending schedule;
    assigning the second refresh unit to a second position, following the first position, of the pending schedule;
    assigning the third refresh unit to a third position of the pending schedule; and
    promoting the third refresh unit from the third position to the second position of the pending schedule, if the first refresh unit is being refreshed and if the third refresh unit serves as the refresh unit.

16. The method of claim 15, further comprising:
downgrading the second refresh unit from the second position to the third position of the pending schedule, if the first refresh unit is being refreshed and if the third refresh unit serves as the refresh unit.

17. The method of claim 10, further comprising:
not refreshing the target row while the refresh unit is being refreshed.

18. The method of claim 10, further comprising:
reading a data from the target row when the target row is refreshed.

\* \* \* \* \*